United States Patent [19]
Fossum et al.

[11] Patent Number: 5,990,506
[45] Date of Patent: Nov. 23, 1999

[54] ACTIVE PIXEL SENSORS WITH SUBSTANTIALLY PLANARIZED COLOR FILTERING ELEMENTS

[75] Inventors: Eric R. Fossum; Sabrina E. Kemeny, both of La Crescenta, Calif.

[73] Assignee: California Institute of Technology, Pasadena, Calif.

[21] Appl. No.: 08/821,157

[22] Filed: Mar. 20, 1997

Related U.S. Application Data

[60] Provisional application No. 60/013,700, Mar. 20, 1996.

[51] Int. Cl.$^6$ .................................................. H01L 21/339
[52] U.S. Cl. ........................... 257/294; 257/222; 257/225; 257/226; 257/227; 257/228; 257/232; 257/233; 257/234; 257/290; 257/291; 257/292; 257/293; 257/294; 250/14; 250/27; 250/357; 250/365
[58] Field of Search ..................................... 257/222, 225, 257/226, 227, 228, 232, 233, 234, 290–293, 239 W, 294; 349/78–80, 97, 104–109; 250/14, 27, 357, 365

[56] References Cited

U.S. PATENT DOCUMENTS

| | | | |
|---|---|---|---|
| 5,321,250 | 6/1994 | Tajima | 250/216 |
| 5,412,705 | 5/1995 | Snoeren et al. | 250/487.1 |
| 5,471,515 | 11/1995 | Fossum et al. | 377/60 |
| 5,479,049 | 12/1995 | Aoki et al. | 257/233 |
| 5,541,402 | 7/1996 | Ackland et al. | 250/208 |
| 5,576,763 | 11/1996 | Ackland | 348/308 |
| 5,654,202 | 8/1997 | Daly et al. | 430/70 |
| 5,656,202 | 8/1997 | Daly et al. | 438/70 |

OTHER PUBLICATIONS

Fossum et al. Application of the Active Pixel Sensor Concept to Guidance and Navigation, SPIE, vol. 1949 paper 30 (1993).

Mendis et al., CMOS Active Pixel Image Sensor, IEEE Transactions on Electrons Devices, 41(3) 452–453.

Mendis et al., Progress in CMOS Active Pixel Image Sensors, SPIE vol. 2172:1–11 (1994).

*Primary Examiner*—Fetsum Abraham
*Attorney, Agent, or Firm*—Fish & Richardson P.C.

[57] ABSTRACT

A semiconductor imaging system preferably having an active pixel sensor array compatible with a CMOS fabrication process. Color-filtering elements such as polymer filters and wavelength-converting phosphors can be integrated with the image sensor.

19 Claims, 5 Drawing Sheets

ACTIVE PIXEL SENSORS WITH
SUBSTANTIALLY PLANARIZED COLOR
FILTERING ELEMENTS

This Application claims the benefit of the U.S. Provisional Application Ser. No. 60/013,700, filed on Mar. 20, 1996, the entirely of which is incorporated herewith by reference.

ORIGIN OF THE INVENTION

The invention described herein was made in the performance of work under a NASA contract, and is subject to the provisions of Public Law 96-517 (35 USC 202) in which the Contractor has elected to retain title.

FIELD OF THE INVENTION

The invention is related to semiconductor imaging devices and in particular to an imaging device which can be fabricated using a standard CMOS process.

BACKGROUND AND SUMMARY OF THE INVENTION

An active pixel sensor ("APS") is a special kind of light sensing device. Each active pixel includes a light sensing element and one or more active transistors within the pixel itself. The active transistors amplify and buffer the signals generated by the light sensing elements in the pixels. One type of such APS devices is disclosed in U.S. Pat. No. 5,471,515 by Fossum et al., the disclosure of which is incorporated herein by reference.

APS devices represent an emerging technology in a wide range of imaging applications. APS has a number of significant advantages in comparison with the well-developed and widely used charge coupled devices (CCDs) and other imaging technologies including photodiode arrays, charge injection devices and hybrid focal plane arrays.

CCD devices have a number of advantages because they are an incumbent technology, they are capable of large formats and very small pixel size and they facilitate noiseless charge domain processing techniques (such as binning and time delay integration). However, CCD imagers suffer from a number of disadvantages. For example, CCD imagers operates with destructive signal read-out and their signal fidelity decreases as the charge transfer efficiency raised to the power of the number of stages. The latter requires a CCD imager to have a nearly perfect charge transfer efficiency. CCD devices are also particularly susceptible to radiation damage and usually require carefully-designed light shielding to avoid smear. Furthermore, CCD imagers usually have high power dissipation for large arrays and limited spectral responsivity range.

In order to ameliorate the charge transfer inefficiency problem, CCD imagers are fabricated with a specialized CCD semiconductor fabrication process to maximize their charge transfer efficiency. One limitation is that the standard CCD process is incompatible with complementary metal oxide semiconductor (CMOS) process, while the image signal processing electronics required for the imager are best fabricated in CMOS. Accordingly, it is impractical to integrate on-chip signal processing electronics in a CCD imager. Thus, the signal processing electronics is off-chip. Typically, each column of CCD pixels is transferred to a corresponding cell of a serial output register, whose output is amplified by a single on-chip amplifier (e.g., a source follower transistor) before being processed in off-chip signal processing electronics. As a result, the read-out frame rate is limited by the rate at which the on-chip amplifier can handle charge packets divided by the number of pixels in the imager.

The other types of imager devices have problems as well. For example, photodiode arrays usually exhibit high noise due to so-called kTC noise which makes it very difficult to reset a diode or capacitor node to the same initial voltage at the beginning of each integration period. Photodiode array, also suffer from lag. Charge injection devices usually exhibit high noise, but enjoy the advantage of non-destructive readout over CCD devices. Hybrid focal plane arrays exhibit low noise but are prohibitively expensive for many applications and have relatively small array sizes (e.g., 512-by-512 pixels).

In contrast, an APS device receives and processes input signals with the active pixel itself, thus eliminating the charge transfer over distances that are inherent in CCDs. Consequently, many drawbacks associated with CCDs are avoided in APS devices. For example, the performance of APS devices can be maintained as the array size increases. The APS readout rate is usually higher than that of CCDs. Since CMOS circuitry is often associated with the image sensor, the power consumption can be significantly reduced. APS devices are inherently compatible with CMOS processes, allowing reduced cost of manufacturing. Many on-chip operations and controls can be relatively easily implemented including timing and analog-to-digital conversion. APS devices are also less vulnerable to radiation damage and can be designed for non-destructive readout. Moreover, the active pixels of APS devices allow random access and on-chip signal processing.

The invention is embodied in an imaging device formed as a monolithic CMOS integrated circuit in an industry standard CMOS process, the integrated circuit including a focal plane array of pixel cells, each one of the cells including a photogate overlying the substrate for accumulating photo-generated charge in an underlying portion of the substrate, a readout circuit including at least an output field effect transistor formed in the substrate, and a charge coupled device section formed on the substrate adjacent the photogate having a sensing node connected to the output transistor and at least one charge coupled device stage for transferring charge from the underlying portion of the substrate to the sensing node.

In a preferred embodiment, the sensing node of the charge coupled device stage includes a floating diffusion, and the charge coupled device stage includes a transfer gate overlying the substrate between the floating diffusion and the photogate. This preferred embodiment can further include apparatus, for periodically resetting a potential of the sensing node to a predetermined potential, including a drain diffusion connected to a drain bias voltage and a reset gate between the floating diffusion and the drain diffusion, the reset gate connected to a reset control signal.

Preferably, the output transistor is a field effect source follower transistor, the floating diffusion being connected to a gate of the source follower transistor. Preferably, the readout circuit further includes a double correlated sampling circuit having an input node connected to the output transistor. In the preferred implementation, the double correlated sampling circuit samples the floating diffusion immediately after it has been reset at one capacitor and then, later, at the end of the integration period at another capacitor. The difference between the two capacitors is the signal output. In accordance with a further refinement, this difference is corrected for fixed pattern noise by subtracting another calibration signal which is a difference sensed between the two capacitors while they are temporarily shorted.

One aspect of the present invention is an implementation of color filtering. Color filters such as polymer filters are preferably integrated with an APS sensor for color separation. Alternatively, a plurality of APS sensors each having a color filter for a different color may to used to achieve maximum imaging resolution.

BRIEF DESCRIPTION OF THE DRAWINGS

These and other aspects and advantages of the present invention will become more apparent in the light of the following detailed description of preferred embodiments thereof, as illustrated in the accompanying drawing, in which.

DETAILED DESCRIPTION OF THE PREFERRED EMBODIMENTS

Figure 1:
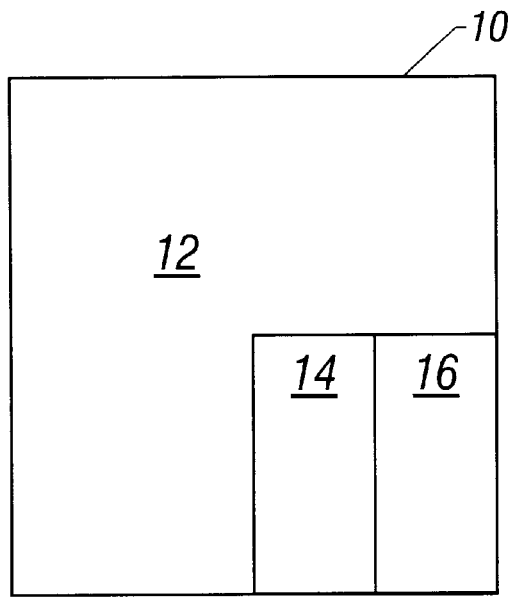
FIG. 1 is a diagram illustrating the architecture of an individual focal plane cell of the invention.
Figure 2:
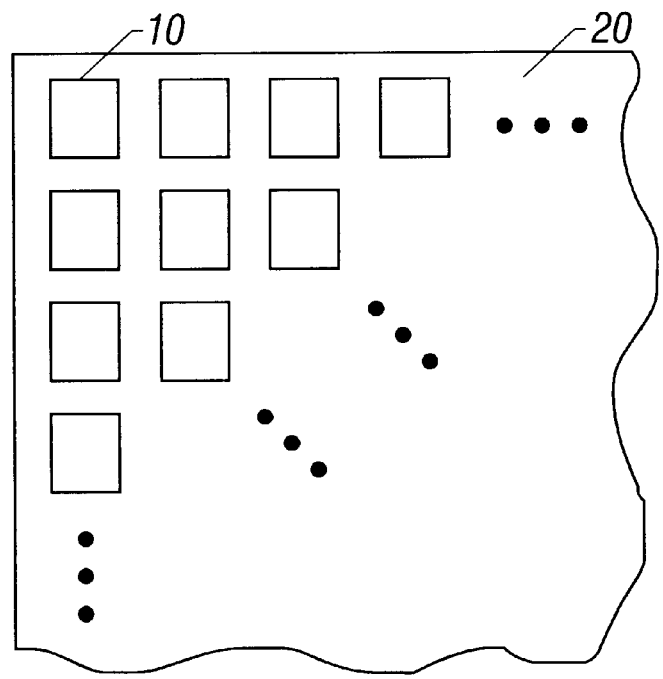
FIG. 2 is a plan view of an integrated circuit constituting a focal plan array of cells of the type illustrated in FIG. 1.
Figure 3:
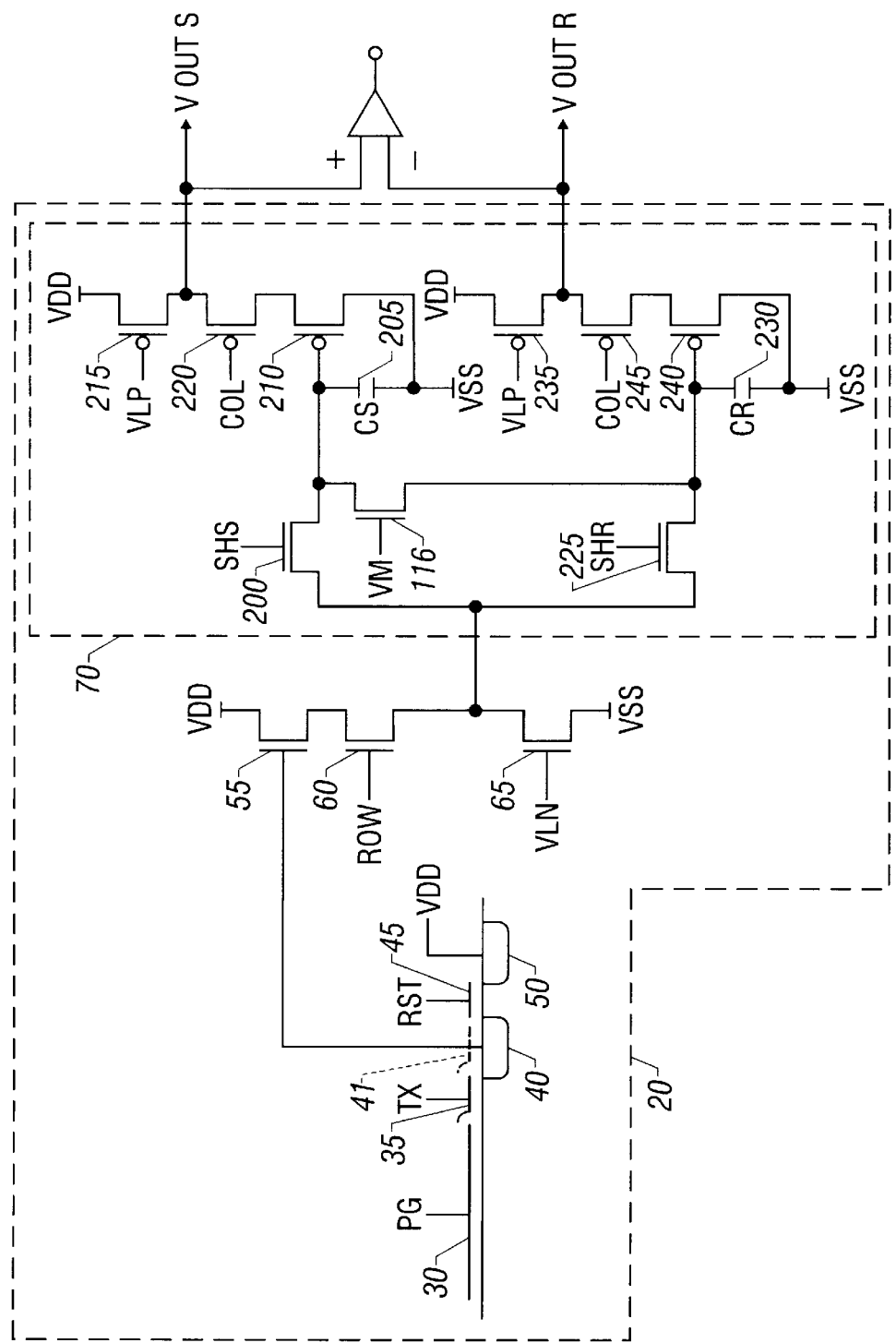
FIG. 3 is a schematic diagram of the cell of FIG. 1.

FIG. 1 is a simplified block diagram of one pixel cell 10 of a focal plane array of many such cells formed in an integrated circuit shown in FIG. 2. Each cell 10 includes a photogate 12, a charge transfer section 14 adjacent to the photogate 12, and a readout circuit 16 adjacent to the charge transfer section 14. FIG. 3 is a simplified schematic diagram of a preferred configuration of cell 10. FIG. 3 shows the photogate 12 with a relatively large photogate electrode 30 overlying the substrate 20. The charge transfer section 14 includes a transfer gate electrode 35 adjacent to the photogate electrode 30, a floating diffusion 40, a reset electrode 45 and a drain diffusion 50. The readout circuit 16 includes a source follower field effect transistor (FET) 55, a row select FET 60, a load FET 65 and a correlated double sampling circuit 70.

Figure 4:
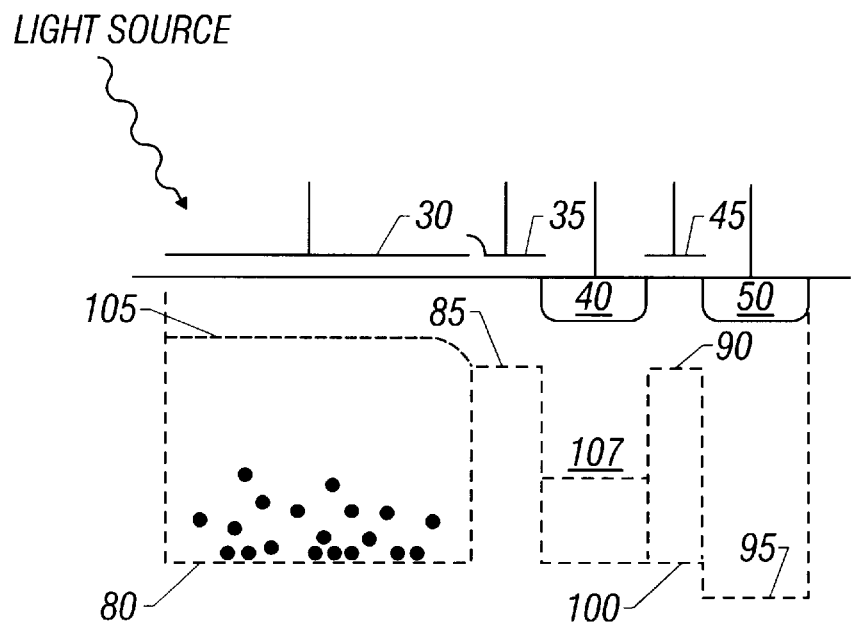
FIG. 4 is a graph of the surface potential in the charge transfer section of the cell of FIG. 3.

FIG. 4 shows the surface potential diagram cell 10. The photogate electrode 30 is held by a photogate signal PG at a positive voltage to form a potential well 80 in the substrate 20 in which photo-generated charge is accumulated during an integration period. The transfer gate electrode 35 is initially held at a less positive voltage by a transfer gate signal TX to form a potential barrier 85 adjacent to the potential well 80. The floating diffusion 40 is connected to the gate of the source follower FET 55 whose drain 50 is connected to a drain supply voltage VDD. The reset electrode 45 is initially held by a reset signal RST at a voltage corresponding to the voltage on the transfer gate 30 to form a potential barrier 90 thereunder. The drain supply voltage VDD connected to the drain diffusion 50 creates a constant potential well 95 underneath the drain diffusion 50.

A preferred operation sequence of cell 10 of FIG. 3 is described as follows. During an integration period, electrons accumulate in the potential well 80 in proportion to photon flux incident on the substrate 20 beneath the photogate electrode 30. At the end of the integration period, the surface potential beneath the floating diffusion 40 is quickly reset to a potential level 100 slightly above the potential well 95. This is accomplished by the reset signal RST temporarily increasing to a higher positive voltage to temporarily remove the potential barrier 90 and provide a downward potential staircase from the transfer gate potential barrier 85 to the drain diffusion potential well 95, as indicated in FIG. 4.

After the reset gate 45 is returned to its initial potential (restoring the potential barrier 90), the readout circuit 70 briefly samples the potential of the floating diffusion 40, and then the cell 10 is ready to transfer the photo-generated charge from beneath the photogate electrode 30. For this purpose, the photogate signal PG deceases to a less positive voltage to form a potential barrier 105 beneath the photogate electrode 30 and thereby provides a downward staircase surface potential from the photogate electrode 30 to the potential well 100 beneath the floating diffusion 40. This transfers all of the charge from beneath the photogate electrode 30 to the floating diffusion 40, changing the potential of the floating diffusion 40 from the level 100 at which it was previously reset to a new level 107 indicative of the amount of charge accumulated during the integration period. This new potential of the floating diffusion 40 is sensed at the source of the source follower FET 55. However, before the readout circuit 70 samples the source of the source follower FET 55, the photogate signal PG returns to its initial (more positive) voltage. The entire process is repeated for the next integration period.

The readout circuit 70 has a signal sample and hold (S/H) circuit including an S/H FET 200 and a signal store capacitor 205 with a first side connected through the S/H FET 200 and through the row select FET 60 to the source of the source follower FET 55. A second side of the capacitor 205 is connected to a source bias voltage VSS. The first side of the capacitor 205 is also connected to the gate of an output FET 210. The drain of the output FET 210 is connected through a column select FET 220 to a signal sample output node VOUTS and through a load FET 215 to the drain voltage VDD. A signal called "signal sample and hold" (SHS) briefly turns on the S/H FET 200 after the charge accumulated beneath the photogate electrode 30 has been transferred to the floating diffusion 40, so that the capacitor 205 stores the source voltage of the source follower FET 55 indicating the amount of charge previously accumulated beneath the photogate electrode 30.

The readout circuit 70 also has a reset sample and hold (S/H) circuit including an S/H FET 225 and a signal store capacitor 230 with a first side connected through the S/H FET 225 and through the row select FET 60 to the source of the source follower FET 55. The second side of the capacitor 230 is connected to the source bias voltage VSS. The first side of the capacitor 230 is also connected to the gate of an output FET 240. The drain of the output FET 240 is connected through a column select FET 245 to a reset sample output node VOUTR and through a load FET 235 to the drain voltage VDD. A signal called "reset sample.and hold" (SHR) briefly turns on the S/H FET 225 immediately after the reset signal RST has caused the resetting of the potential of the floating diffusion 40, so that the capacitor 230 stores the voltage at which the floating diffusion has been reset to.

The readout circuit 70 provides correlated double sampling of the potential of the floating diffusion. The charge accumulated beneath the photogate 12 in each integration period is obtained at the end of each integration period from the difference between the voltages at the output nodes VOUTS and VOUTR of the readout circuit 70. This eliminates the effects of kTC noise because the difference between VOUTS and VOUTR is independent of any variation in the reset voltage RST, a significant advantage.

The focal plane array corresponding to FIGS. 1–4 is preferably implemented in CMOS silicon using an industry standard CMOS fabrication process. Preferably, each of the FETs is a MOSFET, the FETs 55, 60, 65, 200 and 225 being n-channel devices and the FETs 210, 220, 225, 230, 240, 245 being p-channel devices. The n-channel MOSFETS and the CCD channel underlying the gate electrodes 30, 35, 45 and the diffusions 40 and 50 may be located in a p-well while the remaining (p-channel) devices are located outside of the p-well. The gate voltage VLP applied to the gates of the p-channel load FETs 215 and 235 is a constant voltage on the order of +2.5 volts. The gate voltage VLN applied to the n-channel load FET 65 is a constant voltage on the order of +1.5 volts.

The dopant concentrations of the n-channel and p-channel devices and of the various diffusions are preferably in accordance with the above preferred industry standard CMOS process. In one prototype implementation, the area of the L-shaped photogate 12 (i.e., the photogate electrode 30) was about 100 square microns; the transfer gate electrode 35 and the reset gate electrode were each about 1.5 microns by about 6 microns; the photogate signal PG was varied between about +5 volts (its more positive voltage) and about 0 volts (its less positive voltage; the transfer gate signal TX was about +2.5 volts; the reset signal RST was varied between about +5 volts (its more positive voltage) and about +2.5 volts (its less positive voltage); the drain diffusion 50 was held at about +5 volts.

Since the charge transfer section 14 involves only one equivalent single CCD stage between the photogate 12 and the floating diffusion 40 in the specific embodiment of FIG. 3, there is no loss due to charge transfer inefficiency and therefore there is no need to fabricate the device with a special CCD process. As a result, the readout circuit 70 as well as the output circuitry of the FETs 55, and 60 and 65 can be readily implemented as standard CMOS circuits, making them extremely inexpensive. However, any suitable charge coupled device architecture may be employed to implement the charge transfer section 14, including a CCD having more than one stage. For example, two or three stages may be useful for buffering two or three integration periods.

Another feature of the invention which is useful for eliminating fixed pattern noise due to variations in FET threshold voltage across the substrate 20 is a shorting FET 116 across the sampling capacitors 205, 230. After the accumulated charge has been measured as the potential difference between the two output nodes VOUTS and VOUTR, a shorting signal VM is temporarily applied to the gate of the shorting FET 116 and the VOUTS-to VOUTR difference is measured again. This latter difference is a measure of the disparity between the threshold voltages of the output FETs 210, 240, and may be referred to as the fixed pattern difference. The fixed pattern difference is subtracted from the difference between VOUTS and VOUTR measured at the end of the integration period, to remove fixed pattern noise.

Figure 5:
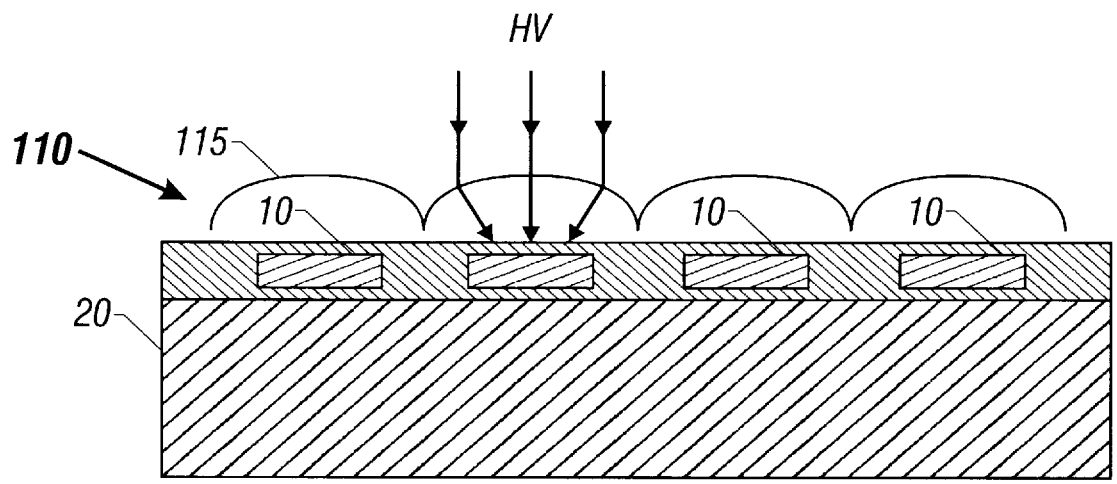
FIG. 5 is a cross-sectional view of an alternative embodiment of the focal plane array of FIG. 2 including a microlens layer.

The inventors found that a light coupling device can be formed on the sensor array to improve the performance thereof. This is shown in FIG. 5. A transparent refractive microlens layer 110 may be deposited over the top of the focal plane array of FIG. 2. The microlens layer 110 consists of spherical portion 115 centered over each of the cells 10 and contoured so as to focus light toward the center of each photogate 12 in each pixel. This has the advantage of using light that would otherwise fall outside of the optically active region of the photogate 12. For example, at least some of the light ordinarily incident on either the charge transfer section 14 or the readout circuit 16 (FIG. 1) would be sensed in the photogate area with the addition of the microlens layer 110.

Figure 6A:
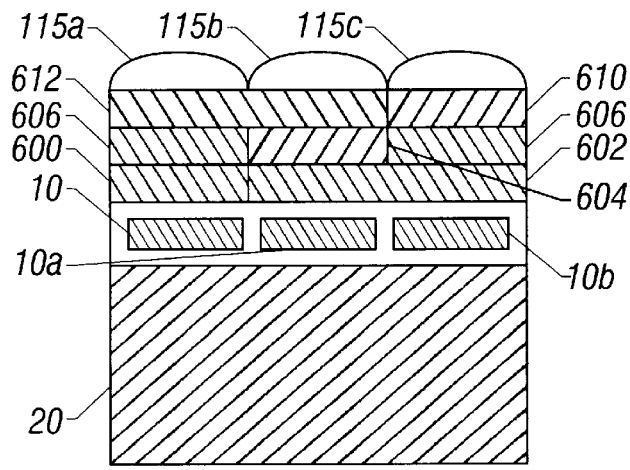
FIG. 6A shows a first embodiment of a single APS sensor with three sets of polymer filters.
Figure 6B:
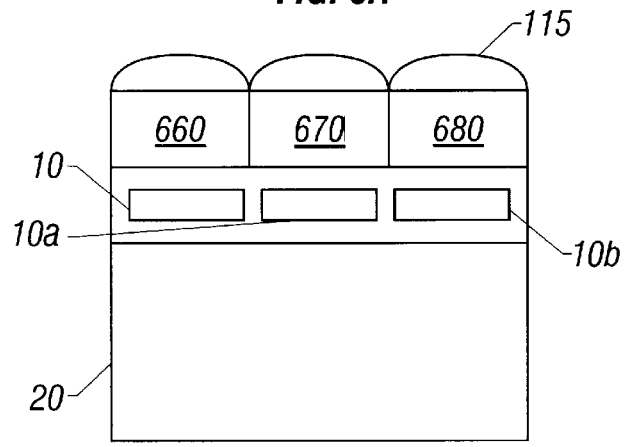
FIG. 6B shows another embodiment of a single APS sensor with three sets of polymer filters.
Figure 6C:
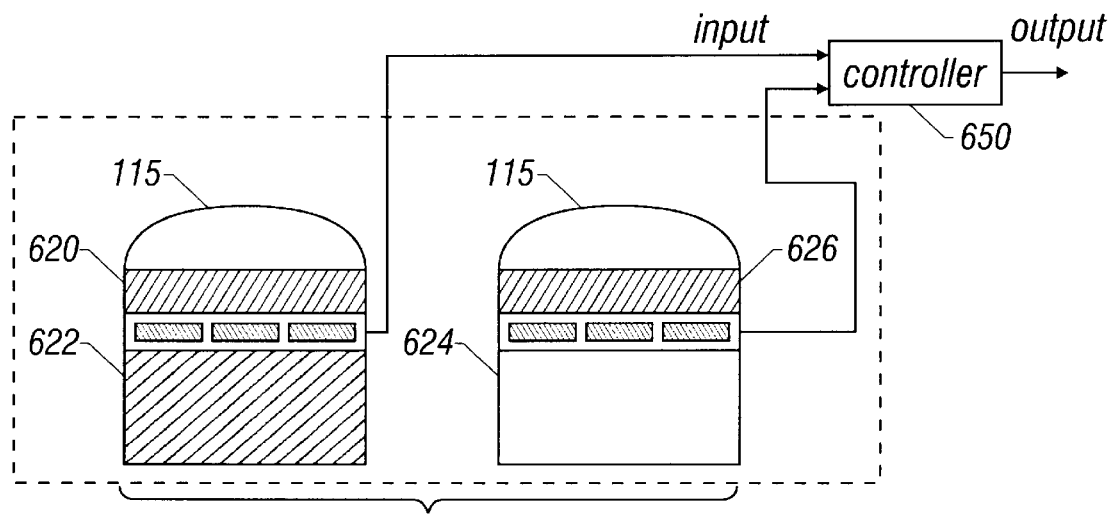
FIG. 6C shows a second embodiment of a plurality of APS sensors each having a different polymer filter.

FIGS. 6A–6C show alternative embodiments of the invention which use color filtering. Color filtering enables spatial separation of color in an imaging device. CCD devices, for example, commonly use color filtering for color separation in this way.

A first preferred system as illustrated in FIG. 6A allows a plurality of pixels to have different color filtering properties to provide a color filtering effect. Typically this is done by using color filters in some array form, for example, alternate green filters interspersed with red and blue filters. An exemplary filter operation would use a plurality of color filters in a sequence such as green/red/green/blue/green/red/green/blue with that pattern continuing for the length of the array.

The system in FIG. 6A uses a polymer color filter array. Such polymer color filter arrays are well-known in the art and are described in various publications, for example, "Solid State Imaging with Charge Coupled Devices", by Albert Theuwissen, Kluwer Academic Press, 1995. Layer 600 is preferably a red layer, and is first deposited over the entire chip having an array of sensing pixels (e.g., 10, 10a, and 10b) on substrate 20. Subsequent to deposition, an etching technique is used to remove the red filter area 600 from everywhere except over the desired pixel 10. A planarization layer 602 formed with a transparent polymeric material covers the removed areas to thereby planarize that surface. Blue filter 604 is next deposited over the flat surface formed by red filter 600 and planarization layer 602. Blue filter 604 is similarly etched such that it only covers the desired pixel 10a. The remaining area is again planarized by a second planarization layer 606. Finally, a green filter 610 is formed over that planarized layer, covering pixel 10b. Planarization layer 612 flattens the resulting area so that green filter 610 only covers the pixel 10b.

Alternatively, the above processing method can use masks so that a desired color filter only forms at one or more selected pixel locations. Another way of forming color filters is to form a first color filtering layer on the entire sensor array. Then the first color filtering layer is patterned to a first desired spatial pattern to expose the rest of the sensor array that is not covered by the patterned first color filtering layer (a mask can be used to achieve the same and then the masking layer is etched). Next, a second color filtering layer is formed in a second spatial pattern in the exposed areas on the sensor array with a mask. Lastly, a third color filtering layer of a third spatial pattern is formed in the remaining area with a mask. Thus, a single color filtering layer is formed on the sensor array with a desired distribution of different filtering materials. This is shown in FIG. 6B.

Also, other color combinations can be used instead of primary colors red, green, and blue. For example, filters for colors cyan, yellow and magenta may be used. Furthermore, other sequence of forming color filtering parts may be used. For example, blue filter can be first formed, then the green, and then the red filter.

According to this embodiment of the present invention, each pixel, including the polymer layers for color filtering, can be covered by microlens 115A, 155B and 115C. The microlenses modify the incoming light in conjunction with the polymer layers. The light is therefore changed by both microlenses 115A–115C and color filtering parts 612, 606, and 600. Each pixel, therefore, preferably receives light that has been doubly modified in this way.

This polymer color filter array causes the device to lose a certain amount of resolution of the scene being imaged since some of the pixels are dedicated to a different color. For example, if three neighboring pixels are combined to represent one color image element, the effective image resolution will be reduced by a factor of three.

A second embodiment shown in FIG. 6C does not lose resolution, but instead requires multiple chips to form an image. This alternative embodiment uses a plurality of APS chips that are substantially identical to one another. Each APS chip is coated with a different color filtering film. For example, an AOPS device 622 has a green filter 620 in the system of FIG. 6C. Therefore, two other APS devices are also necessary for a full color operation, each of which acts a different color filter. Device 624, for example, includes a blue filter 626. This arrangement allows device 622 to receive a different color than device 626. Each device is preferably covered by microlens 115. The different color images from different sensors such as 622 and 624 can be correlated to produce a final image. An electronic controller 650 can be implemented to perform the image correlation. The controller 650 receives images of different colors from different sensors such as 622 and 624 to form the final image.

The inventors further contemplate that a wavelength-converting phosphor can be implemented with an APS device. This is necessary in some applications since the spectral response of an APS device is limited. For example, many silicon-based APS devices are limited in visible or near infrared spectral bands and not efficient in detecting blue, UV, or X-ray bands. A wavelength-converting phosphor is typically tuned to accept radiation of a desired wavelength, e.g., ultra-violet or x-ray. Therefore, the phosphor, when receiving this radiation, emits a photon of the proper type to properly excite the underlying silicon.

The wavelength-converting phosphor could be deposited atop of a sensor array in an APS device so that a radiation signal outside the spectral response range of the APS can still be detected. Thus, the advantages of an APS device can be utilized.

Figure 7:
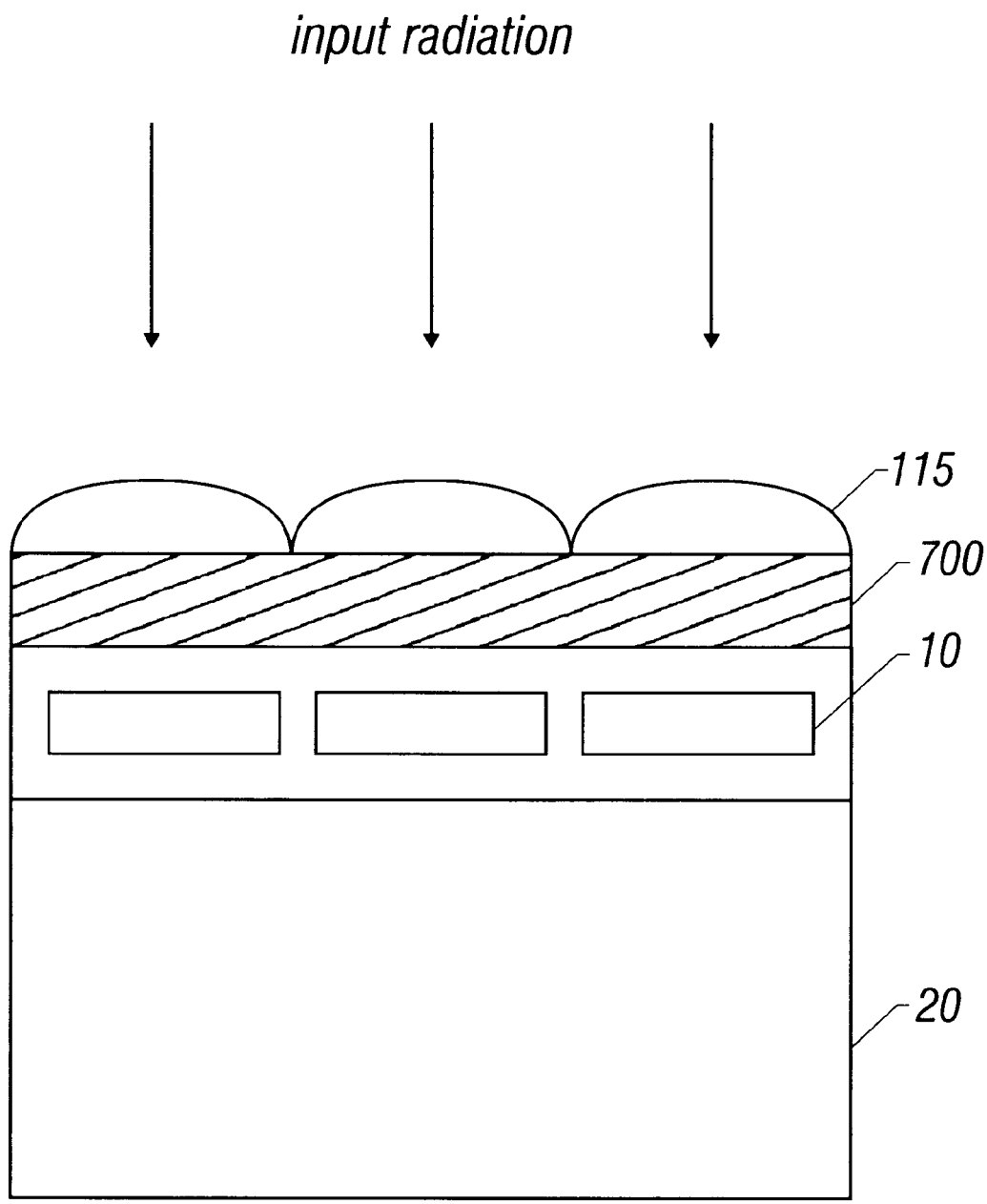
FIG. 7 shows an APS device with an integrated phosphor layer.

FIG. 7 shows one preferred embodiment of such a system. A layer of a suitable phosphor 700 is formed on the top of the sensor array having active pixels 10 on substrate 20. Different phosphors can be used depending on the wavelength range of the input signal. The phosphor layer 700 receives the input radiation and emits photons that are detectable by the pixels 10. Therefore, the signals from the pixels 10 can be converted into an image indicative of the input radiation. One application of this system is X-ray sensors.

Although the present invention has been described in detail with reference to the preferred embodiments, one ordinarily skilled in the art to which this invention pertains will appreciate that various modifications and enhancements may be predictable.

For example, the floating diffusion 40 may instead be a floating gate electrode. Such a floating gate is indicated schematically in FIG. 3 by a simplified dashed line floating ga-e electrode 41. The signal and reset sample and hold circuits of the readout circuit 70 may be any suitable sample and hold circuits. Moreover, shielding of the type well-known in the art may be employed defining an aperture surrounding the photogate 12. Also, the invention may be implemented as a buried channel device.

What is claimed is:

1. An integrated semiconductor imaging device, comprising:

a sensor array having a plurality of pixel circuits disposed relative to one another on a semiconductor substrate, each of said pixel circuits including an optical sensor to receive light and an electronic element having at least one active transistor to convert said light into an electrical signal, wherein said pixel circuits are operable to generate an indicia indicative of an input scene;

a first color filtering layer formed on said sensor array to cover a first portion of said sensor array and configured to transmit light in at least a first selected spectral bandwidth and absorb light that is substantially outside said first selected bandwidth, said optical sensor in each of said pixel circuits in said first portion being responsive in said first selected spectral bandwidth; and a first transparent layer, formed on said sensor array and displaced relative to said first color filtering layer to cover a remaining portion of said sensor array that is not covered by said first color filtering layer, said first transparent layer and said first color filtering layer being substantially of a same thickness and forming a first planarized layer which has a substantially flat upper surface on said first sensor array to cover said pixel circuits.

2. A device as in claim 1, further comprising:

a second color filtering layer formed over said first planarized layer and disposed relative to said first color filtering layer to cover a second portion of said sensor array, said second color filtering layer operating to transmit light in at least a second selected spectral bandwidth and absorb light that is substantially outside said second selected bandwidth, said optical sensor in each of said pixel circuits in said second portion being responsive in said second selected spectral bandwidth;

a second transparent layer, formed over said first planarized layer, displaced relative to said second color filtering layer to cover a remaining portion of said first planarized layer that is not covered by said second color filtering layer, said second transparent layer and said second color filtering layer being substantially of a same thickness and forming a second planarized layer over said first planarized layer;

a third color filtering layer formed over said second planarized layer and disposed relative to said first and second color filtering layers to cover a third portion of said sensor array, said third color filtering layer operating to transmit light at least in a third selected spectral bandwidth and absorb light that is substantially outside said third selected bandwidth, said optical sensor in each of said pixel circuits in said third portion being responsive in said third selected spectral bandwidth; and a third transparent layer, formed over said second planarized layer and displaced relative to said third color filtering layer to cover a remaining portion of said second planarized layer that is not covered by said third color filtering layer, said third transparent layer and said third color filtering layer being substantially of a same thickness and forming a third planarized layer over said second planarized layer, whereby each optical sensor in each of said pixel circuits receives a light beam that only transmits through one of said first, second and third color filtering layers.

3. A device as in claim 2, wherein said first color filtering layer has a first spatial pattern, said second color filtering layer has a second spatial pattern, and said third color filtering layer has a third spatial pattern.

4. A device as in claim 3, wherein said first, second, and third spatial patterns are arranged with respect to one another so that one of said pixels receiving light filtered by one of said three color filtering layers has two neighboring pixels each receiving light filtered by one of other two of said three color filtering layers.

5. A device as in claim 2, wherein at least one of said first, second, and third color filtering layers is made of a polymeric material.

6. A device as in claim 2, wherein at least one of said first, second, and third transparent layers is made of a polymeric material.

7. A device as in claim 2, further comprising a light coupling array of microlenses formed on said third planarized layer, each microlens in said light coupling array being positioned over a pixel circuit of said sensor array so that light received by said optical sensor passes through one of said microlenses and one of said color filtering layers.

8. An imaging system capable of color filtering, comprising:
   a plurality of semiconductor substrates separated from one another;
   a plurality of sensor arrays respectively formed on said substrates and each having a plurality of pixel circuits, each pixel circuit in each sensor array including an optical sensor to receive light and an electronic element having at least one active transistor to convert said light into an electrical signal, said sensor arrays disposed relative to one another to receive an input image and operable to respectively generate indicia of different colors of the input image; and
   an electronic controller, coupled to said sensor arrays to correlate said indicia of different colors from said sensor arrays to compose a final image of said input image.

9. A device as in claim 8, wherein each of said sensor arrays comprises a light coupling array of microlenses formed over said pixel circuits, each microlens in said light coupling array being positioned over a pixel circuit of said first sensor array to couple light to said optical sensor in said pixel circuit.

10. A system as in claim 8, wherein said plurality of sensor arrays include:
    a first sensor array having a first color filtering layer formed to cover respective pixel circuits, operating to transmit light in a first selected spectral bandwidth and absorb light that is substantially outside said first selected bandwidth, said first sensor array producing a first image representing said input image in said first selected bandwidth;
    a second sensor array having a second color filtering layer formed to cover respective pixel circuits, operating to transmit light in a second selected spectral bandwidth different from said first selected bandwidth and absorb light that is substantially outside said second selected bandwidth, said second sensor array producing a second image representing said input image in said second selected bandwidth; and
    a third sensor array having a third color filtering layer formed to cover respective pixel circuits, operating to transmit light in a third selected spectral bandwidth different from said first and second selected bandwidths and absorb light that is substantially outside said third selected bandwidth, said third sensor array producing a third image representing said input image in said third selected bandwidth, wherein said electronic controller correlates said first, second, and third images to form said final image with colors based on said first, second, and third selected bandwidths.

11. A system as in claim 10, wherein at least one of said first, second, and third color filtering layers is made of a polymeric material.

12. An integrated imaging sensor, comprising:
    an active pixel sensor array, having a plurality of active pixels responsive to photons in a first spectral range, each of said active pixels having at least one active transistor and operating to covert said photons into an electrical signal; and
    a phosphor layer formed on top of said sensor array, operable to convert radiation in a second spectral range into said first spectral range, said second spectral range being out of said first spectral range, whereby said integrated imaging sensor is operable to detect a signal in said second spectral range.

13. A sensor as in claim 12, wherein said first spectral range is within a range in which a silicon-based photosensor is responsive.

14. A sensor as in claim 12, wherein said second spectral range is within ultraviolet range or in X-ray range.

15. An integrated semiconductor imaging device, comprising:
    a sensor array having a plurality of active pixel circuits disposed relative to one another on a semiconductor substrate, each of said active pixel circuits including an optical sensor to receive light and at least one active transistor to convert said light into an electrical signal, wherein said pixel circuits are operable to generate an indicia indicative of an input scene; and
    a substantially planarized color filtering layer formed on said sensor array to cover said active pixel circuits and configured to effect color filtering and color separation on said input scene, said color filtering layer formed of an array of color filtering regions which are arranged relative to one another in said color filtering layer and have an one-to-one correspondence to said active pixel circuits, wherein said color filtering regions include at least three different types corresponding to three different transmitted colors.

16. Device as in claim 15, further comprising a light coupling array of microlenses formed over said color filtering layer, each microlens in said light coupling array being positioned over an active pixel circuit of said first sensor array to couple light to said optical sensor in said active pixel circuit through said color filtering layer.

17. A method for constructing and operating an integrated semiconductor imaging device, comprising:
    forming a plurality of pixel circuits disposed relative to one another on a semiconductor substrate to provide a sensor array, each of said pixel circuits including an optical sensor to receive light and an electronic element having at least one active transistor to convert said light into an electrical signal, wherein said pixel circuits are operable to generate an indicia indicative cf an input scene; and separating frequency components in said input scene into three different frequency ranges by using first, second and third color filtering layers sequentially formed on said sensor array, wherein each of said color filtering layers includes a plurality of color filtering regions covering selected pixel circuits of said sensor array and a plurality of transparent regions disposed relative to said color filtering regions to form a planarized layer and to cover pixel circuits that are not covered by said color filtering regions, and color filtering regions in one layer being of a same type that is different from color filtering regions of another layer.

18. A method as in claim 17, further comprising forming a microlens array over said third color filtering layer to couple said input scene to said pixel circuits through said third, second and first color filtering layers.

19. A method for constructing and operating an integrated semiconductor imaging device, comprising:

forming a plurality of pixel circuits disposed relative to one another on a semiconductor substrate to provide a sensor array, each of said pixel circuits including an optical sensor to receive light and an electronic element having at least one active transistor to convert said light into an electrical signal, wherein said pixel circuits are operable to generate an indicia indicative of an input scene;

separating frequency components in said input scene into three different frequency ranges by using a substantially planarized color filtering layer formed on said sensor array to cover said pixel circuits, said color filtering layer formed of an array of color filtering regions which are arranged relative to one another in said color filtering layer and have an one-to-one correspondence to said pixel circuits, wherein said color filtering regions include at least three different types corresponding to said three different frequency ranges; and forming a microlens array over said third color filtering layer to couple said input scene to said pixel circuits through said third, second and first color filtering layers.

* * * * *